US007087561B2

(12) United States Patent
Yates et al.

(10) Patent No.: US 7,087,561 B2
(45) Date of Patent: Aug. 8, 2006

(54) CLEANING COMPOSITION USEFUL IN SEMICONDUCTOR INTEGRATED CIRCUIT FABRICATION

(75) Inventors: Donald L. Yates, Boise, ID (US); Max F. Hineman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 10/187,163

(22) Filed: Jul. 1, 2002

(65) Prior Publication Data

US 2002/0169089 A1 Nov. 14, 2002

Related U.S. Application Data

(62) Division of application No. 09/584,552, filed on May 31, 2000, now Pat. No. 6,486,108.

(51) Int. Cl.
*H01L 21/302* (2006.01)

(52) U.S. Cl. ...................... 510/175; 510/176; 510/177; 510/477; 134/3

(58) Field of Classification Search ................ 510/175, 510/176, 177, 254, 505, 506; 134/1.3, 40, 134/41, 2; 252/79.1, 79.4, 79.2, 79.3; 438/692, 438/693, 745
See application file for complete search history.

(56) References Cited

U.S. PATENT DOCUMENTS 4,145,451 A 3/1979 Oles ........................... 426/321
4,230,522 A 10/1980 Martin et al. ............... 156/638
4,256,520 A 3/1981 Koike et al. ................ 148/171
4,339,340 A 7/1982 Muraoka et al. ........... 252/79.5
4,415,606 A 11/1983 Cynkar et al. ................ 427/90
4,642,168 A 2/1987 Imai ...................... 204/129.65
4,764,213 A 8/1988 Gventer et al. ................ 106/2
4,895,617 A 1/1990 Roche et al. ............... 156/665

(Continued)

FOREIGN PATENT DOCUMENTS

EP 649168 A2 4/1995

(Continued)

OTHER PUBLICATIONS

Banas, J..,"Passivity of metals in anhydrous solutions of oxy-acids", *Materials Science Forum vols. 185-188*, (1995),pp. 845-852.

(Continued)

*Primary Examiner*—Gregory Webb
(74) *Attorney, Agent, or Firm*—Schwegman, Lundberg, Woesnner & Kluth, P.A.

(57) ABSTRACT

A composition for use in semiconductor processing wherein the composition comprises water, phosphoric acid, and an organic acid; wherein the organic acid is ascorbic acid or is an organic acid having two or more carboxylic acid groups (e.g., citric acid). The water can be present in about 40 wt. % to about 85 wt. % of the composition, the phosphoric acid can be present in about 0.01 wt. % to about 10 wt. % of the composition, and the organic acid can be present in about 10 wt. % to about 60 wt. % of the composition. The composition can be used for cleaning various surfaces, such as, for example, patterned metal layers and vias by exposing the surfaces to the composition.

41 Claims, 7 Drawing Sheets

U.S. PATENT DOCUMENTS

| | | | | |
|---|---|---|---|---|
| 5,258,093 | A | 11/1993 | Manier | 156/626 |
| 5,262,285 | A | 11/1993 | Darmon et al. | 430/359 |
| 5,376,235 | A | 12/1994 | Langley | 156/664 |
| 5,508,229 | A | 4/1996 | Baker | 437/183 |
| 5,560,857 | A | 10/1996 | Sakon et al. | 510/175 |
| 5,645,648 | A | 7/1997 | Laut et al. | 134/2 |
| 5,689,334 | A | 11/1997 | Atkinson et al. | 356/326 |
| 5,789,360 | A | 8/1998 | Song et al. | 510/175 |
| 5,800,577 | A | 9/1998 | Kido | 51/307 |
| 5,855,811 | A | 1/1999 | Grieger et al. | 252/79.3 |
| 5,939,336 | A | 8/1999 | Yates | 438/753 |
| 5,972,862 | A | 10/1999 | Torii et al. | 510/175 |
| 6,012,469 | A | 1/2000 | Li et al. | 134/1.3 |
| 6,063,306 | A | 5/2000 | Kaufman et al. | 252/79.4 |
| 6,136,767 | A | 10/2000 | Hineman et al. | 510/176 |
| 6,143,705 | A * | 11/2000 | Kakizawa et al. | |
| 6,265,781 | B1 | 7/2001 | Andreas | 257/765 |
| 6,410,494 | B1 | 6/2002 | Kakizawa et al. | 510/175 |
| 6,453,914 | B1 * | 9/2002 | Torek et al. | 134/1.2 |
| 6,486,108 | B1 * | 11/2002 | Yates et al. | 510/175 |
| 6,534,459 | B1 * | 3/2003 | Yata et al. | 510/176 |
| 6,562,726 | B1 * | 5/2003 | Torek et al. | 438/745 |
| 6,596,647 | B1 | 7/2003 | Hineman et al. | 475/243 |

FOREIGN PATENT DOCUMENTS

| | | | |
|---|---|---|---|
| EP | 784336 | A2 | 7/1997 |
| EP | 789071 | A1 | 8/1997 |
| JP | 5037372 | | 4/1975 |
| JP | 5716488 | | 1/1982 |
| JP | 6122982 | | 1/1986 |
| JP | 62125633 | | 6/1987 |
| JP | 62211391 | | 9/1987 |
| JP | 63133535 | | 6/1988 |
| JP | 848996 | | 2/1996 |
| WO | WO-97/05228 | | 2/1997 |
| WO | WO-97/18582 | | 5/1997 |

OTHER PUBLICATIONS

Dingley, W..,et al. ,"An Improved Bismuth Plating Process", *Plating and Surface*, 63(4), (1976),pp. 26-33.

Ghilarducci, A..,et al. ,"The Bordoni Relaxation in High Purity Copper single Crystals at Low Frequencies", *Journal De Physique*, 6, (1996),pp. 211-214.

Molt, K..,et al. ,"Analysis of aqueous solutions by near-infrared spectrometry (NIRS) II. Titrations of weak and very weak acids with strong bases", *Journal Molecular Structure*, 410-411, (1997),pp.565-572.

Muzzo, G..P. ,"Observacions numericas y graficas de la reduccion volumen de las soluciones acuosas", *Boletin de La Sociedad Quimica Del Peru XLII*, (1976),pp. 179-191.

Petrow, G.., *Metallographic Etching*, American Society for Metals, Gebruder Borntraeger, Berlin,(1976),pp. 37, 96.

Petzow, G.., *In: Metallographic Etching*, American Society for Metals, Metals Park, OH,(1983),p. 94.

Sastri, V..S. ,et al. ,"Studies on the Determination of Surface Deuterium in AISI 1062, 4037, and 4140 Steels by Secondary Ion Mass Spectrometry", *Metallurgical Transactions A, 19A*, (1988),pp. 3071-3075.

Singh, V..B. ,et al. ,"Active, passive and transpassive dissolution of a nickel base super alloy in concentrated acid mixture solution", *Materials and Corrosion*, 46, (1995),pp. 590-594.

Viktorova, E..N. ,et al. ,"Aqueous solution of phosperic acid as the stationery liquid phase for selective separation of fatty acids under conditions of steam chromatography", *Russian Chemical Bulletin*, 46(3), (1997),pp. 476-478.

* cited by examiner

A B

CLEANING COMPOSITION USEFUL IN SEMICONDUCTOR INTEGRATED CIRCUIT FABRICATION

CROSS-REFERENCE TO RELATED APPLICATION(S)

This application is a division of U.S. patent application Ser. No. 09/584,552, filed on May 31, 2000 now U.S. Pat. No. 6,486,108, the specification of which is hereby incorporated by reference.

FIELD OF THE INVENTION

The present invention relates to the fabrication of semiconductor integrated circuits, and in particular, to cleaning compositions and methods for cleaning surfaces during fabrication.

BACKGROUND OF THE INVENTION

In the manufacture of integrated circuits, interconnects are used to couple active and passive devices together and to couple together conductive lines formed on different layers of the integrated circuits. To keep the resistivity in the interconnects low, interconnects are generally fabricated from good conductors, such as aluminum, copper, or alloys of aluminum or copper. Keeping the resistivity of the interconnects low decreases the heat generated in the interconnects, which permits the fabrication of higher density circuits.

Unfortunately, even for interconnects having a low resistivity, the interface between the interconnect and an active or passive device or the interface between the interconnect and a conductive line may have a high resistivity. High resistivity at an interconnect interface is often caused by an unclean surface at the interface. Preclean procedures and preclean chemicals, such as phosphoric acid, and hydrofluoric acid, are used to prepare semiconductor surfaces at interconnect interface sites. Unfortunately, these chemicals contain strong (i.e., concentrated and not dilute) organic solvents, which require special hazardous waste disposal techniques.

For example, U.S. patent application Ser. No. 08/808,014 (which is assigned to the same assignee of the present invention) discloses suitable compositions useful as cleaning compositions in integrated circuits semiconductor fabrication. The compositions include water, phosphoric acid, and acetic acid. The compositions are successful in reducing surface aluminum fluorides but require special hazardous waste disposal techniques. Preclean procedures and chemicals are also used to prepare metal surfaces, such as aluminum or copper surfaces, at interconnect interface sites. Unfortunately, the common contaminants, such as residual organic and metallic impurities are difficult to remove, and the conventional cleaning compositions also require special hazardous waste disposal techniques.

For these and other reasons there is a need for the present invention.

SUMMARY OF THE INVENTION

The present invention provides a composition useful as a cleaning composition in semiconductor integrated circuit fabrication. The composition of the present invention provides improved solvation of metallized polymers and organic polymers over previously used cleaning compositions, such as standard phosphoric acid cleans. The composition is advantageous as compared with previously used strong (i.e., concentrated and not dilute) organic solvent cleans because the composition does not require special hazardous waste disposal. In addition, the composition of the present invention sufficiently reduces the overall volume of etch residue remaining post-clean.

In one embodiment, the present invention provides a composition useful as a cleaning composition in semiconductor integrated circuit fabrication. The composition includes water, phosphoric acid, and an organic acid. The organic acid is ascorbic acid or is an organic acid having two or more carboxylic acid groups. In one specific embodiment of the invention, the organic acid is citric acid, ascorbic acid, or a combination thereof.

In an alternative embodiment, the present invention provides another composition useful as a cleaning composition in semiconductor integrated circuit fabrication. The composition includes about 40 wt. % to about 85 wt. % water, about 0.01 wt. % to about 10 wt. % phosphoric acid, and about 10 wt. % to about 60 wt. % of an organic acid, wherein the organic acid is ascorbic acid or is an organic acid having two or more carboxylic acid groups; wherein the composition is useful as a cleaning composition in semiconductor integrated circuit fabrication. In one specific embodiment of the invention, the organic acid is citric acid, ascorbic acid, or a combination thereof.

In an alternative embodiment, the present invention provides another composition useful as a cleaning composition in semiconductor integrated circuit fabrication. The composition includes about 40 wt. % to about 85 wt. % water, about 0.01 wt. % to about 10 wt. % phosphoric acid, and about 10 wt. % to about 60 wt. % of ascorbic acid, citric acid, or a combination thereof; wherein the composition is useful as a cleaning composition in semiconductor integrated circuit fabrication.

In an alternative embodiment, the present invention provides a cleaning method in a semiconductor fabrication process. The method includes providing a composition of the present invention and exposing a surface to the composition.

In an alternative embodiment, the present invention provides a method of fabricating an interconnect structure. The method includes patterning a conductive layer and cleaning the conductive layer using a composition of the present invention.

In an alternative embodiment, the present invention provides a method of fabricating a multilevel interconnect structure. The method includes providing an insulating layer over a first metal layer; defining a via in the insulating layer, resulting in residue on an exposed portion of the first metal layer; and removing the residue using a composition of the present invention.

In an alternative embodiment, the present invention provides a method of fabricating a multilevel interconnect structure. The method includes patterning a first metal layer over a contact hole using a photoresist and etchant; forming an insulating layer over the first metal layer; defining a via in the insulating layer over the first metal layer, resulting in organic residue on at least a portion of the via; and removing the organic residue on the via using a composition of the present invention.

DETAILED DESCRIPTION OF THE INVENTION

Figure 1A:
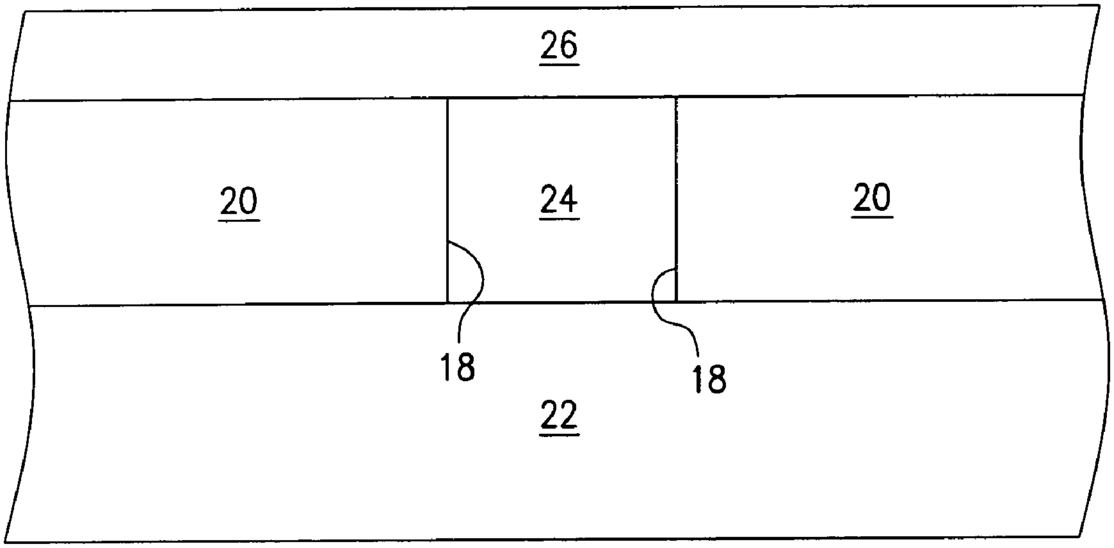
FIGS. 1A to 1K are cross-sectional representations of a multilevel interconnect structure formed using a cleaning composition including phosphoric acid and an organic acid, wherein the organic acid is ascorbic acid or the organic acid includes two or more carboxylic acid groups; in accordance with the present invention, and intermediate structures thereof.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

In one embodiment of the present invention, the composition of the present invention includes phosphoric acid and an organic acid. The composition can be shipped and/or stored in a relatively concentrated form, wherein the composition includes relatively little or no carrier (e.g., water). Alternatively, the composition can be diluted with a carrier (e.g., water) prior to shipping and/or storing. The composition, however, should be diluted with a carrier (e.g., water), to the suitable concentration disclosed herein, prior to use.

It has surprisingly been discovered that the compositions of the present invention, in the concentrations specified herein, prevent removal of too much material from the surface being cleaned. In addition, it has surprisingly been discovered that the components of the composition of the present invention, in the concentrations specified herein, are safe to the user.

Specifically, the water can be present in about 40 wt. % to about 85 wt. % of the composition. More specifically, water can be present in about 55 wt. % to about 75 wt. % of the composition. In addition, the water can be deionized water.

Specifically, the phosphoric acid can be present in about 0.01 wt. % to about 10 wt. % of the composition. More specifically, the phosphoric acid can be present in about 0.5 wt. % to about 5.0 wt. % of the composition. Phosphoric acid is commercially available from, e.g., Aldrich (Milwaukee, Wis.). Phosphoric acid is typically available as an 85 wt. % solution in water. With the use of 85 wt. % phosphoric acid, it is necessary to account for the 15 wt. % of water present in the phosphoric acid in formulating the composition of the present invention.

The organic acid can be ascorbic acid or can be a compound having two or more carboxylic acid groups. As used herein, ascorbic acid (commonly known as Vitamin C), is commercially available from, e.g., Aldrich (Milwaukee, Wis.). Ascorbic acid is typically available in the solid (i.e., powder) form, which can subsequently be diluted in water.

As used herein, a carboxylic acid group is a carbonyl group that is bonded to a hydroxyl group (e.g., C(=O)OH). Suitable organic acids having two or more carboxylic acid groups are disclosed, e.g., in *Aldrich Handbook of Fine Chemicals and Laboratory Equipment*, Aldrich, (2000–2001), Milwaukee, Wis. and *Sigma Biochemicals and Reagents*, Sigma, St. Louis, Mo. Preferably, the organic acid having two or more carboxylic acid groups can effectively aid in the composition of the present invention to dissolve any organic compounds (e.g., organo silicates and/or soluble aluminum fluorides) present on the surface (e.g., side wall of a via) to be cleaned. Suitable organic acids having two or more carboxylic acid groups include, e.g., citric acid and oxalic acid, which are commercially available from, e.g., Aldrich (Milwaukee, Wis.) and Sigma (St. Louis, Mo.).

Specifically, the organic acid can be present in about 10 wt. % to about 60 wt. % of the composition. More specifically, the organic acid can be present in about 20 wt. % to about 50 wt. % of the composition or about 25 wt. % to about 40 wt. % of the composition.

One particularly suitable composition of the present invention includes about 60 wt. % to about 70 wt. % water, about 2 wt. % to about 3 wt. % phosphoric acid; and about 30 wt. % to about 40 wt. % citric acid.

The composition of the present invention can be formulated in any suitable manner. Preferably, the phosphoric acid and the organic acid (e.g., citric acid) are each added to the water. More preferably, the phosphoric acid and the organic acid (e.g., citric acid) are each added to the water slowly while stirring. It is appreciated that those of skill in the art understand that the rapid addition of water to a concentrated inorganic acid (e.g., phosphoric acid) is an exothermic process and can result in the mixture bubbling or spattering. As such, the acid or acids should be added to the water and not vice-versa. Preferably, the phosphoric acid and the organic acid (e.g., citric acid) are each added to the water slowly while stirring wherein the water is cooled, for example, in an ice-bath.

One particularly suitable composition of the present invention is formulated by combining about 1 part of a first composition that includes about 20 mL of water and about 1 mL of phosphoric acid (85 wt. % in water) and about 1.3 parts of a second solution that includes citric acid (about 50 wt. % in water).

Figure 2:
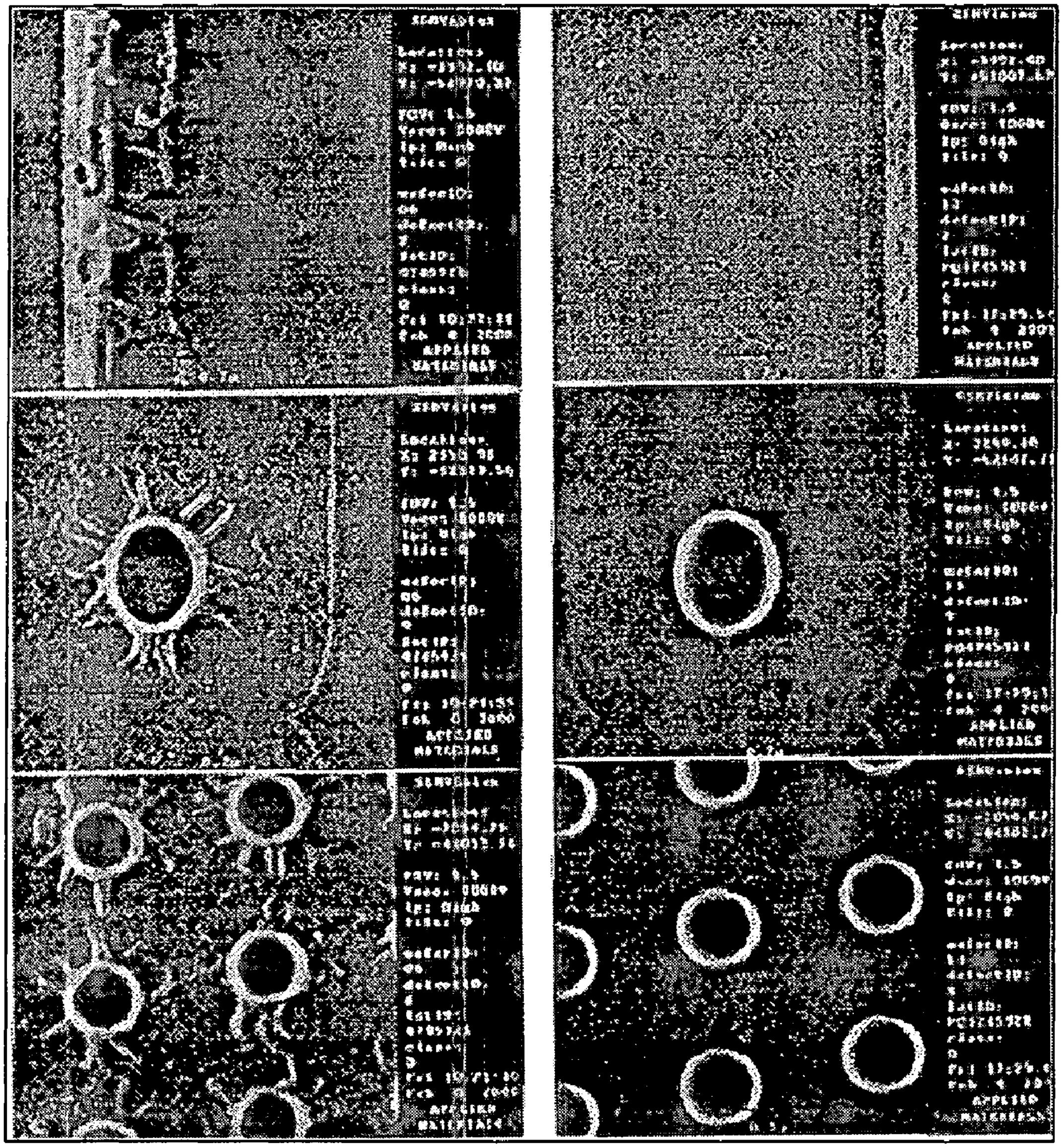
FIG. 2A illustrates post clean wafers employing a control (20:1 phosphoric acid/water).
FIG. 2B illustrates post clean wafers employing a composition of the present invention.

It has surprisingly been discovered that the compositions of the present invention are useful as a cleaning composition in semiconductor integrated circuit fabrication. See, FIG. 2. It has also been surprisingly been discovered that the compositions provide improved solvation of metallized polymers and organic polymers than previously used cleaning compositions, such as standard phosphoric acid cleans.

The compositions are advantageous as compared with previously used strong (i.e., concentrated and not dilute) organic solvent cleans because the compositions of the present invention do not require special hazardous waste disposal. The compositions also provide improved solvation of metallized polymers and organic polymers over previously used cleaning compositions, such as standard phosphoric acid cleans. See, FIG. 2.

The compositions of the present invention can optionally include additives such as cleaning agents (e.g., acetic acid), surfactants, passivation agents, and/or oxidation agents (e.g., nitric acid). For example, passivation agents, such as ethylene glycol, propylene glycol, and/or triethanolamine, may be added to the compositions to aid in passivating the metal surface so as to reduce the amount of metal loss during the cleaning step.

The compositions can optionally be heated above ambient temperature prior to use and/or during use. Specifically, the compositions can be heated in a circulating bath prior to its use. The compositions can be heated to about 50 degrees Celsius or less. If higher temperatures are used, the integrity of underlying metallic layers is possibly degraded.

Temperatures of about 30 degrees Celsius to about 45 degrees Celsius are suitable for optimizing the cleaning abilities without severe metal loss from underlying layers when the composition includes water in about 40 wt. % to about 85 wt. % of the composition, phosphoric acid in about 0.01 wt. % to about 10 wt. % of the composition, and the organic acid (e.g., citric acid) in about 10 wt. % to about 60 wt. % of the composition.

When relatively low concentrations of the acidic components are present in the composition, higher temperatures may be effectively used without severe metal loss from underlying layers. Similarly, when relatively high concentrations of the acidic components are present in the composition, lower temperatures may need to be used to avoid severe metal loss from underlying layers.

The compositions of the present invention are typically used for cleans performed in the fabrication of an interconnect structure. For example, the compositions of the present invention are useful for cleans performed in fabricating a multilevel interconnect structure. Interconnect structure, as used herein, refers to vias, contacts, metal lines/patterned layers, pads, and similar conductive circuitry utilized in an integrated circuit. FIGS. 1A to 1K illustrate a multilevel interconnect structure and intermediate structures thereof. Dimensions and scaling in the Figures are not exact, but represent the nature of fabricating a multilevel interconnect structure in general and the necessity for utilizing the compositions of the present invention for cleaning intermediate structures thereof.

In the fabrication of a multilevel interconnect structure, a contact hole 18 is typically defined in an insulating layer 20, such as, for example, borophosphosilicate glass (BPSG), as illustrated in FIG. 1A. The contact hole 18 is defined over an active area of an underlying substrate, as represented generally by 22. An interconnect structure 24 is then formed in the contact hole 18 using any suitable materials and methods for forming the same. Typical interconnect 24 fabrication includes formation of a series of layers, such as, for example, titanium silicide, titanium nitride, and a metal plug or other conductive layers. Next, a blanket layer of metal 26 is deposited over the interconnect structure 24 and insulating layer 20, to produce the structure illustrated in FIG. 1A. The metal layer 26 can be any conductive material, such as, for example, aluminum or aluminum alloyed with copper. Other elements that can constitute the conductive material include titanium and silicon.

Figure 1B:
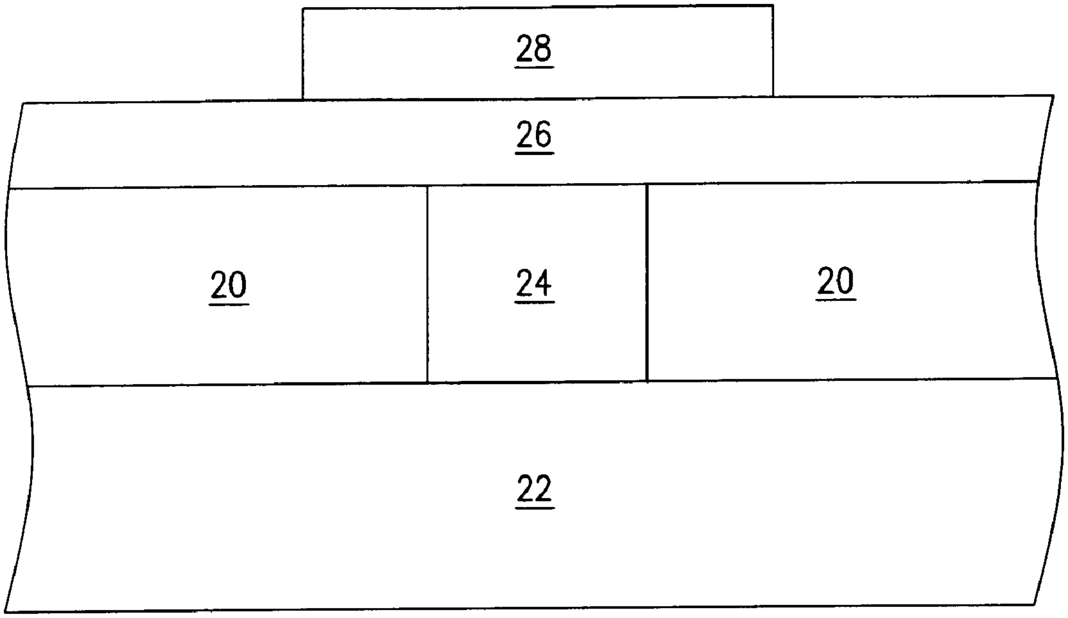

A photoresist layer 28 is then deposited on the metal layer 26 and patterned as well known to one skilled in the art, resulting in the structure illustrated in FIG. 1B. The metal layer 26 is then etched in exposed areas, resulting in the metal line structure illustrated in FIG. 1C.

The etchant used to pattern the metal layer 26 varies. For patterning aluminum, chlorine-containing etchants are typically used, i.e., for example, $Cl_2$, $BCl_3$, $CCl_4$, $SiCl_4$ and combinations thereof. However, the exact nature of the etchant is not critical to the scope of the invention.

Residue 29, such as organic residue of etch-related polymers, often remains on the exposed metal surface 26. Depending on the constituent elements of the exposed metal surface 26, the etchant, and the etch-related polymers, the chemical nature of the residue 29 varies. For example, titanium, aluminum, copper, and silicon are common elements utilized in semiconductor fabrication. Carbon, chlorine, and fluorine are common elements utilized in etchants. Carbon, nitrogen, and hydrogen are common elements utilized in etch-related polymers. These elements, or combinations thereof, are typically found in residue 29 on such surfaces 26. Furthermore, oxygen may be present in the residue 29 as a result of the etch-related polymer stripping, for example, when using an oxygen ash for removal of photoresist. In particular, when the etchant contains chlorine, the organic residue 29 often includes aluminum chloride or copper chloride, for example, when the exposed metal 26 surface is aluminum or aluminum alloyed with copper.

Figure 1C:
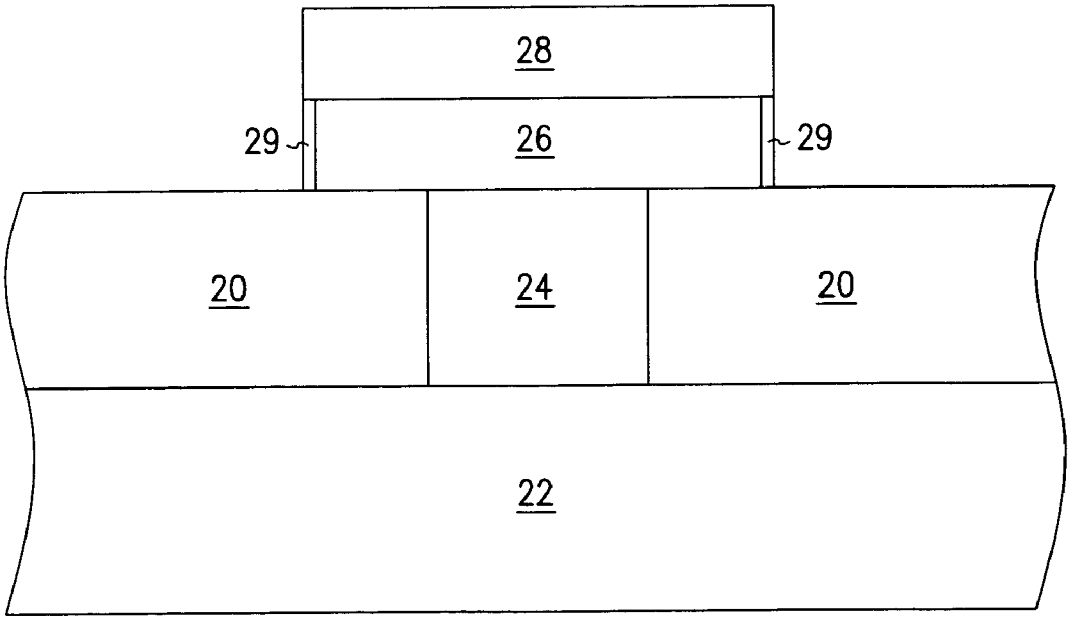

In order to prepare the surface of the structure illustrated in FIG. 1C for insulating layer deposition, the photoresist layer 28 is next removed. To remove the photoresist layer 28 and/or other etch-related polymers after patterning the first metal layer 26, an oxygen ash is commonly used, or any suitable method (wet or dry), as well known to one skilled in the art. For example, a typical oxygen ash includes heating the structure in a furnace having a temperature of about 200 to 300 degrees Celsius and in the presence of an oxygen-containing plasma. Other examples include heating the structure in the presence of an ozone-containing environment or wet cleaning the structure using organic strippers.

Figure 1D:
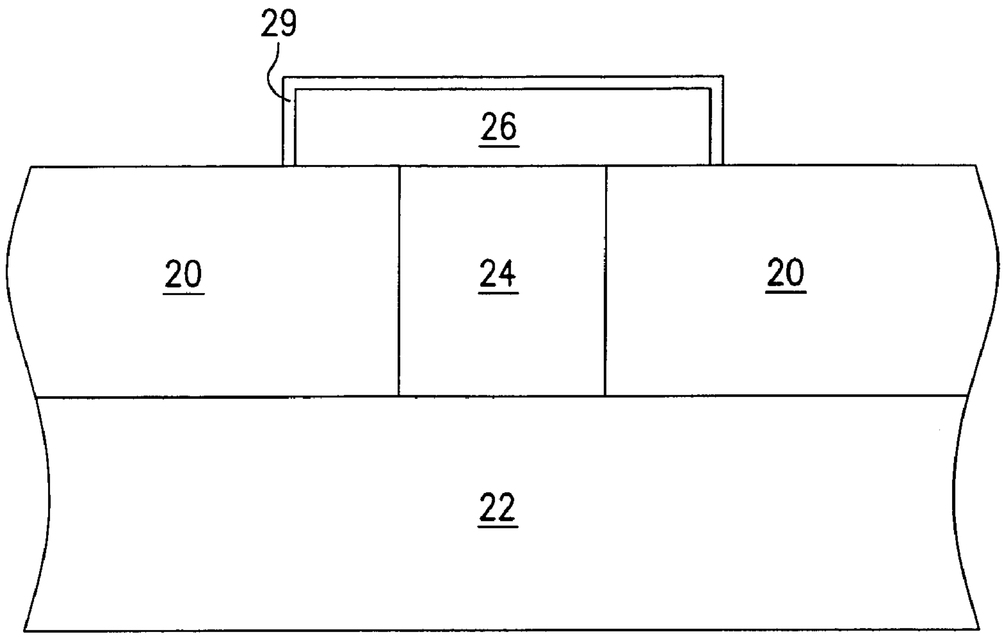

Even after the oxygen ash step, residue 29, such as organic components from the photoresist 28 often remain on the first metal layer 26, as illustrated in FIG. 1D. If not removed, such residue 29 increases the resistivity of the interconnect structure, degrading electrical performance. The longer the first metal layer 26 is exposed to the photoresist 28 during the etch process, the harder it becomes to effectively remove all of the residue 29, such as organic residue 29, from the surface of the first metal layer 26. This is due to the fact that the organic materials become metallized, as previously mentioned. Thus, the structure illustrated in FIG. 1D is exposed to the cleaning composition of this invention after the oxygen ash step. The exposure time needed for effectively cleaning the metallized organic residue 29 varies. The exposure time is adjusted to allow for adequate cleaning without removing excess metal from underlying surfaces.

As one example, an exposure time of about forty-five seconds to about seventy-five seconds appears to provide an adequate balance between these two competing factors, such as, for example, when using a composition that includes water in about 40 wt. % to about 85 wt. % of the composition, phosphoric acid in about 0.01 wt. % to about 10 wt. % of the composition, and the organic acid (e.g., citric acid) in about 10 wt. % to about 60 wt. % of the composition. The cleaning composition of this invention is more effective than conventionally used standard phosphoric acid compositions at removing such residue 29, including any metallized organic elements, due to the organic acid component.

Figure 1E:
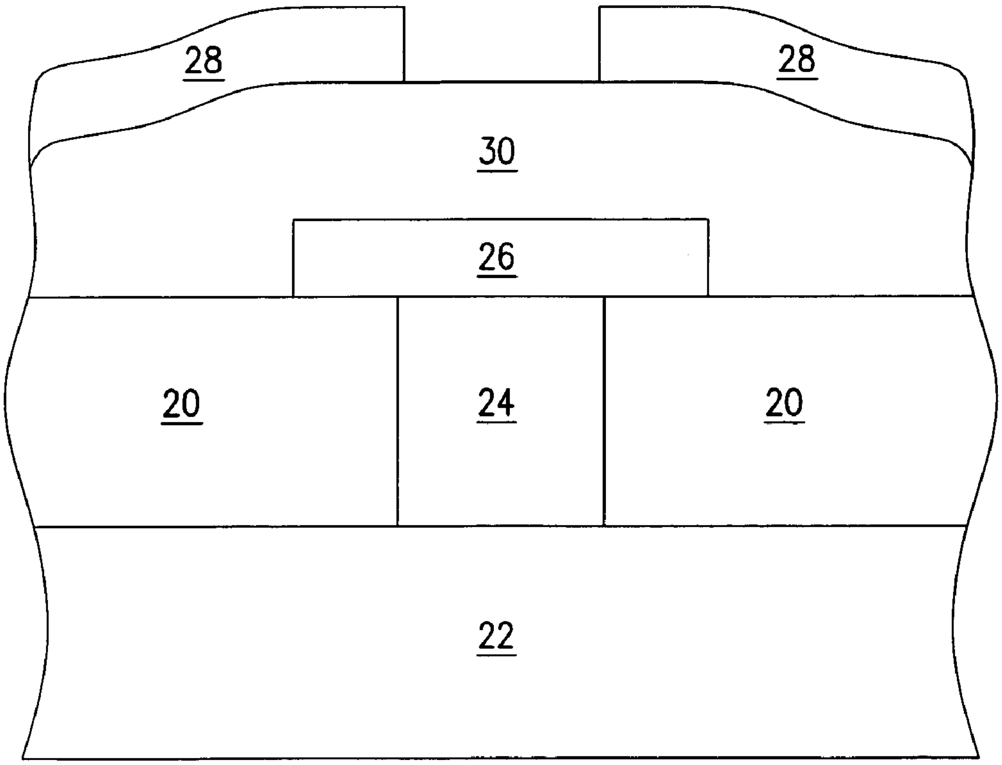

After the first metal layer 26 is patterned and cleaned with the composition of this invention, an insulating layer 30 is formed over the first metal layer 26, as illustrated in FIG. 1E. The insulating layer 30 can be any dielectric material, such as, for example, silicon dioxide, spin-on-glass, or borophosphosilicate glass. Typically the insulating layer 30 has a low dielectric constant and is formed at relatively low temperatures. Silicon dioxide may be used for the insulating layer 30. The silicon dioxide 30 is formed using any well-known technique, such as, for example, tetraethyloxysilicate (TEOS)-based plasma-enhanced chemical vapor deposition (PECVD). The thickness of the insulating layer 30 is determined according to the feature sizes of the integrated circuit as well known to one skilled in the art.

Figure 1F:
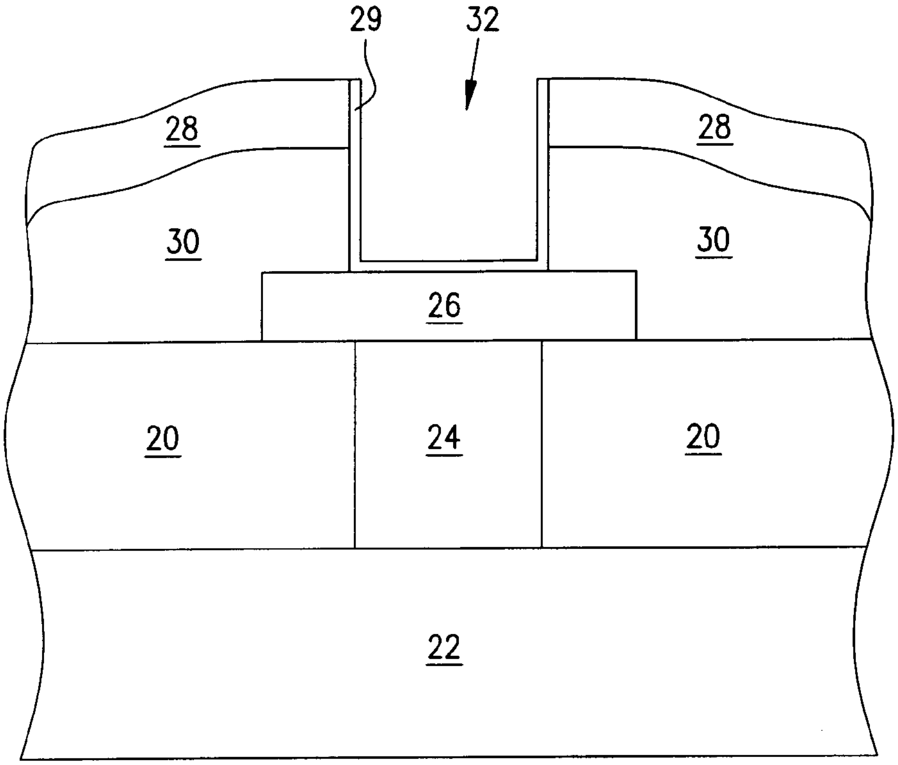

To define a via in the insulating layer 30, a photoresist layer 28 is patterned over the insulating layer 30, as illustrated in FIG. 1E. The via 32 is then defined in the exposed portions of the insulating layer 30 by etching away the exposed insulating layer 30, the resulting structure of which is illustrated in FIG. 1F. The etchant used to define the via 32 varies. Typical etches often include more than one step. For example, to define a via 32, a wet etch at standard temperature may be followed by a dry etch (i.e., plasma etch), two adjacent dry etches may be used instead, or a single dry etch may also be used.

For etching silicon dioxide, plasma etchants often contain a fluorine component. Typical etchants include, but are not limited to, $CF_4$, $C_2F_6$, $C_3F_8$, $CHF_3$, $NF_3$, $SF_6$ and combinations thereof. Once again, residue 29, such as organic residue 29 of etch-related polymers, often remains on the exposed metal 26 surface. As previously described, however, the chemical nature of such residue 29 varies depending on the constituent elements of the exposed metal surface 26, the etchant, and the etch-related polymers. In particular, when the etchant contains fluorine, the residue 29 often includes metal fluorides, such as, for example, aluminum fluoride, if the exposed metal 26 is aluminum.

Figure 1G:
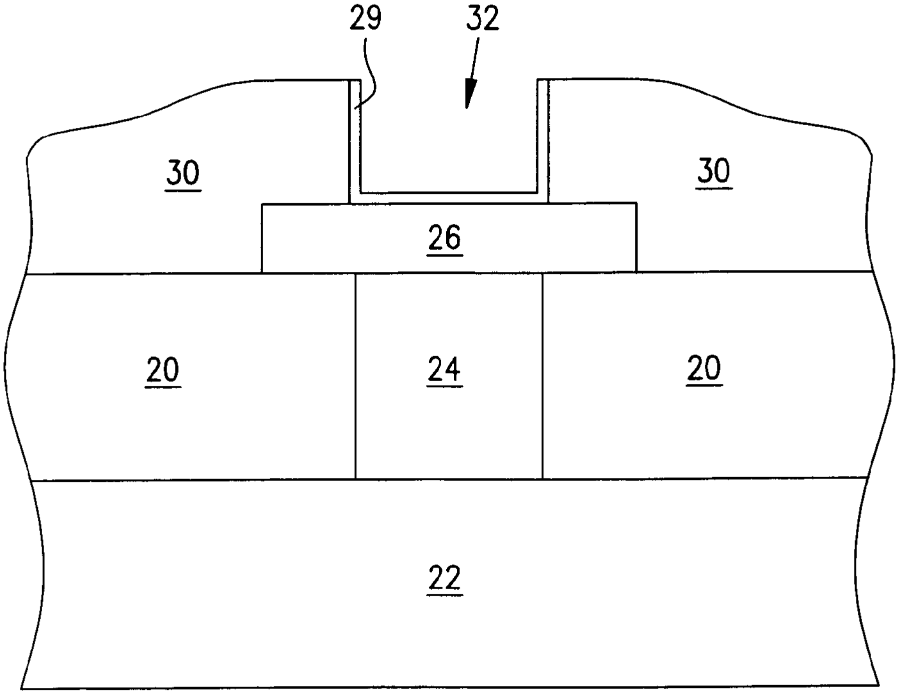

In order to prepare the surface for the next metal layer deposition, the photoresist layer 28 is removed, resulting in the structure illustrated in FIG. 1G. To remove the photoresist layer 28 and/or etch-related polymers after defining the via 32, an oxygen ash, or any suitable method, is commonly used, as described previously.

After the oxygen ash step, residue 29, such as organic components from the photoresist 28 often remain on the first metal layer 26 at the bottom of the via and on the sidewalls of the via 32 at the insulating layer 30 interface. The longer the first metal layer 26 is exposed at the bottom of the via 32, the harder it becomes to effectively remove all of the residue 29 at the bottom of the via 32. This is due to the fact that the organic materials become metallized, as previously described. Thus, the structure illustrated in FIG. 1G is exposed to the cleaning composition of this invention after the oxygen ash step.

The exposure time needed for effectively cleaning the metallized organic residue 29 varies. The exposure time must be adjusted to allow for adequate cleaning without removing excess metal from underlying surfaces. As one example, an exposure time of about one minute seems to provide an adequate balance between these two competing factors.

The cleaning composition of this invention is more effective than conventionally used phosphoric acid compositions at removing such residue 29. However, while piranha cleans (i.e., mixtures of hydrogen peroxide and sulfuric acid) are used for cleaning contact holes, they cannot be used for cleaning vias 32 and metallic surfaces 26, due to their extreme reactivity. The extreme reactivity of such conventional cleans results in severe metal loss from exposed metal surfaces.

Figure 1H:
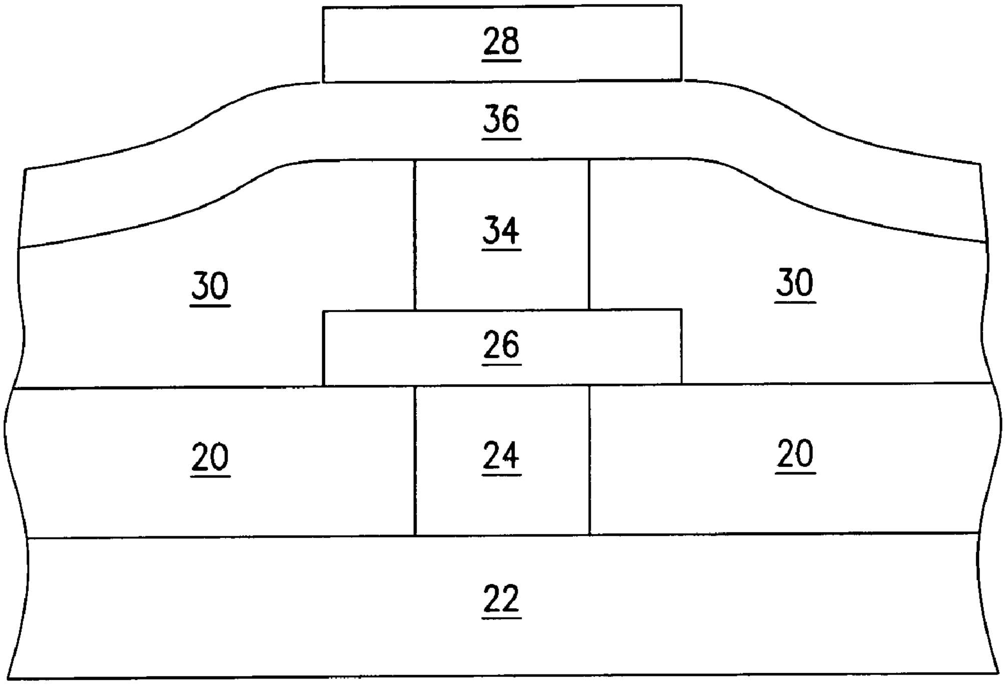
Figure 1I:
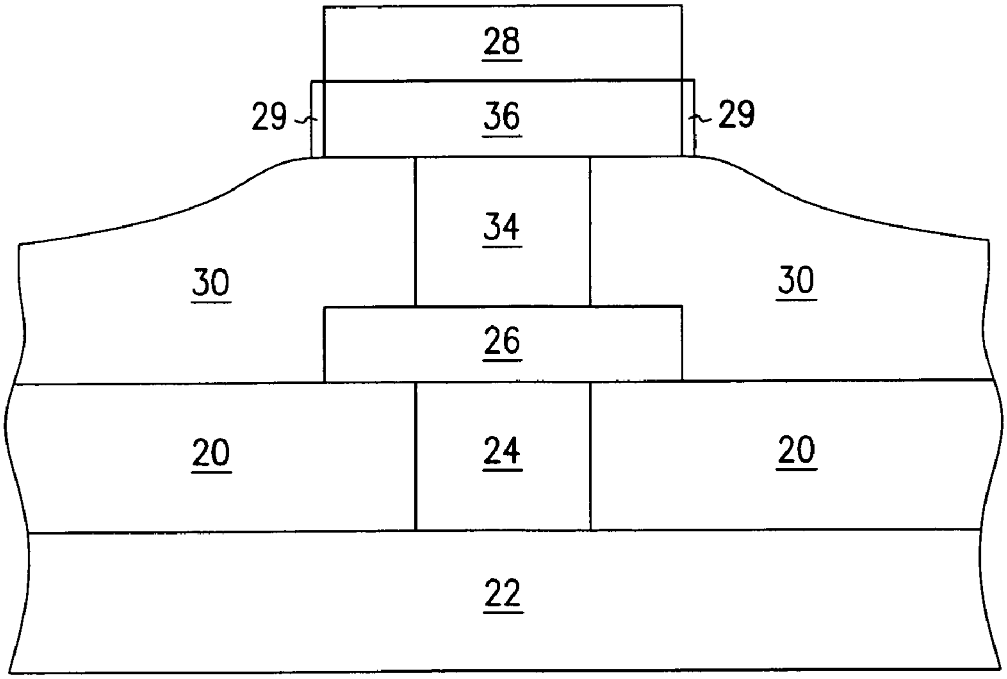

Next, as illustrated in FIG. 1H, an interconnect structure 34 is formed in the via 32 and a second metal layer 36 is formed over the insulating layer 30 and structure 34. The second metal layer 36, like the first metal layer 26 and any subsequent metal layers, can be any conductive material, such as, for example, aluminum or aluminum alloyed with copper. Furthermore, the conductive material constituents can include titanium and/or silicon. The second metal layer 36 is then patterned, as well known to one skilled in the art. A patterned photoresist layer 28 is formed over the second metal layer 36, as illustrated in FIG. 1H. The second metal layer 36 is then etched in exposed areas, the resulting structure of which is illustrated in FIG. 1I. The resulting structure often undesirably contains residue 29, such as organic residue 29, on the exposed surfaces of the second metal layer 36. The etchant used to pattern the second metal layer 36 varies, as described previously, contributing to the presence of the residue 29 on the metal surfaces.

In order to prepare the surface of the structure illustrated in FIG. 11 for deposition of subsequent layers, the photoresist layer 28 is next removed. To remove the photoresist layer 28 and/or etch-related polymers after patterning the second metal layer 36, an oxygen ash, or any suitable method, is commonly used, as described previously.

Figure 1J:
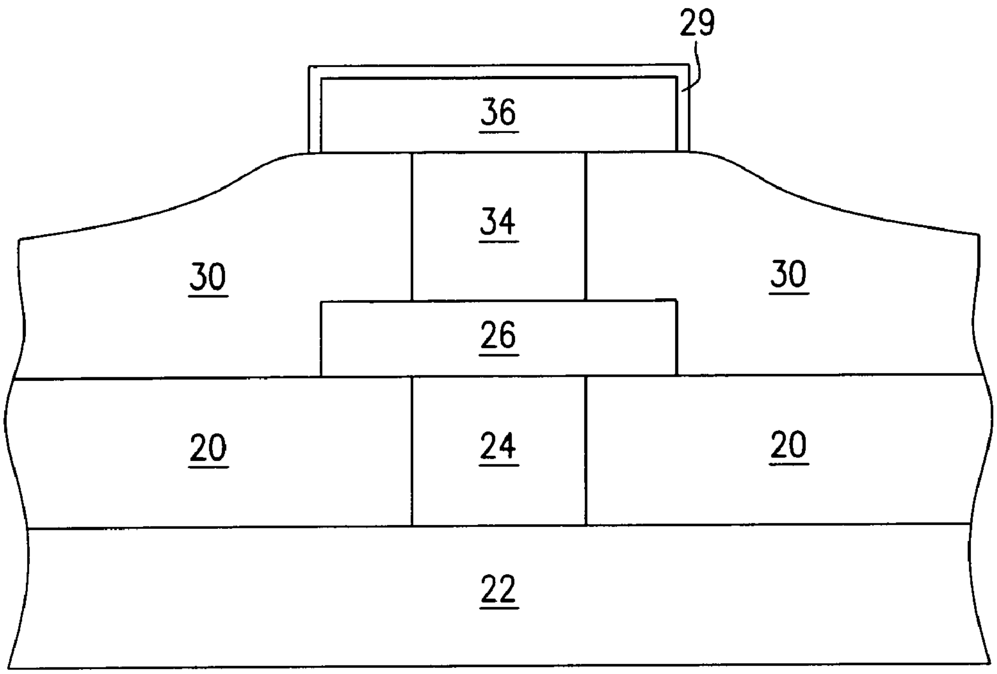
Figure 1K:
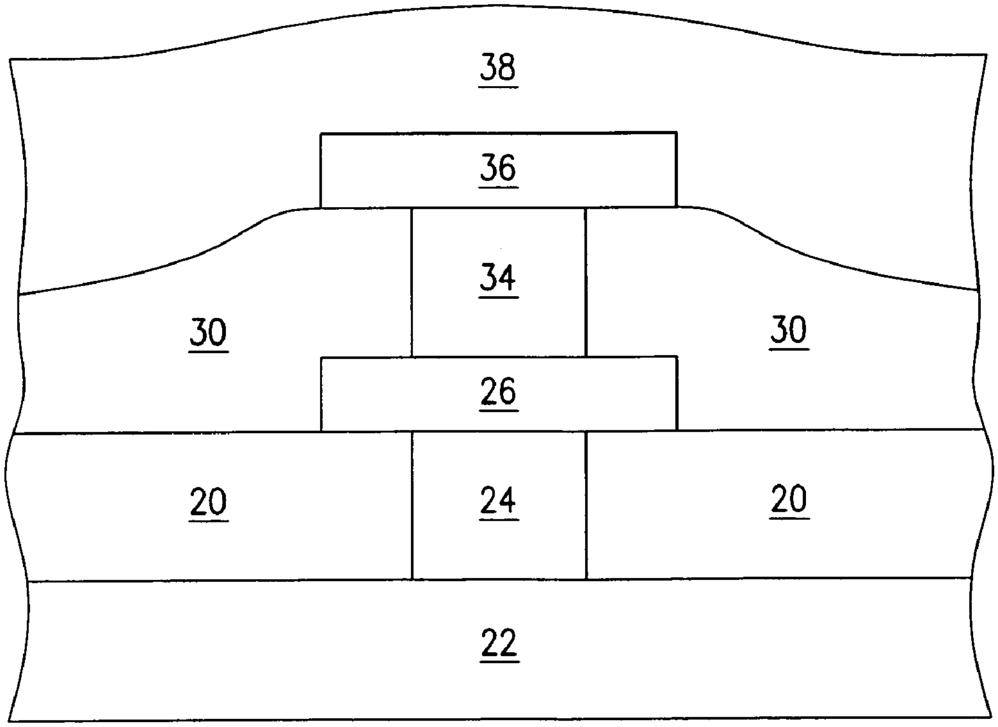

After the oxygen ash step, residue 29, such as organic components from the photoresist 28, often remain on the second metal layer 36, as illustrated in FIG. 1J. The longer the second metal layer 36 is exposed to the photoresist 28 during the etch process, the harder it becomes to effectively remove all of the residue 29 from the surface of the second metal layer 36. This is due to the fact that the organic materials become metallized, as described previously. Thus, the structure illustrated in FIG. 1J is exposed to the cleaning composition of this invention after the oxygen ash step. The exposure time needed for effectively cleaning the metallized organic residue 29 varies. The exposure time must be adjusted to allow for adequate cleaning without removing excess metal from underlying surfaces.

As one example, an exposure time of about forty-five seconds to about seventy-five seconds seems to provide an adequate balance between these two competing factors, when using a composition that includes water in about 40 wt. % to about 85 wt. % of the composition, phosphoric acid in about 0.01 wt. % to about 10 wt. % of the composition, and the organic acid (e.g., citric acid) in about 10 wt. % to about 60 wt. % of the composition; at temperatures of about 30 to about 45 degrees Celsius.

If the multilevel interconnect structure includes more than two levels of metal, subsequent insulating layers, vias, and metal layers are formed thereon, as described previously and represented generally as 38 in FIG. 1K. The intermediate structures are cleaned in the composition of the present invention, as described previously. However, not every surface clean must be performed with the cleaning composition of the present invention, but it is advantageous to do so for achieving optimum electrical performance. The present cleaning composition may be used for one or more of the cleans when forming a multilevel interconnect structure.

The composition of the present invention effectively removes metallized organic residue 29 from metal surfaces, without deleteriously removing too much of the metal surface. By removing such residue 29, resulting resistivity of an IC is lowered. This is critical for the continued increase in device density, enabling fabrication of faster IS with lower power consumption. Furthermore, due to the absence of strong (i.e., concentrated and not dilute) organic solvents in the composition, use of the cleaner is even more desirable because it doesn't require special hazardous waste disposal procedures.

It is to be understood that the above description is intended to be illustrative, and not restrictive. Many other embodiments will be apparent to those of skill in the art upon reviewing the above description. For example, the cleaning composition of this invention is particularly useful wherever a metal surface needs to be cleaned during the fabrication process. The scope of the invention should, therefore, be determined with reference to the appended claims, along with the full scope of equivalents to which such claims are entitled.

What is claimed is:

1. A cleaning method in a semiconductor fabrication process, comprising:

providing a composition comprising water, phosphoric acid, and about 20 wt. % to about 50 wt. % ascorbic acid; and exposing a surface to the composition.

2. The method of claim 1 wherein the water is present in about 40 wt. % to about 85 wt. % of the composition.

3. The method of claim 1 wherein the water is deionized water.

4. The method of claim 1 wherein the phosphoric acid is present in about 0.01 wt. % to about 10 wt. % of the composition.

5. The method of claim 1 wherein the composition comprises about 40 wt. % to about 85 wt. % of water, about 0.01 wt. % to about 10 wt. % of phosphoric acid, and about 20 wt. % to about 50 wt. % of ascorbic acid or citric acid.

6. The method of claim 1 wherein the composition is heated to a temperature of less than about 50 degrees Celsius.

7. The method of claim 1 wherein the composition is heated to a temperature of about 30 to about 45 degrees Celsius.

8. The method of claim 1 wherein the surface is of a conductive layer.

9. The method of claim 8 wherein the conductive layer comprises aluminum.

10. The method of claim 1 wherein the method includes etching a material resulting in metallized organic residue on at least a part of the surface.

11. The method of claim 1 wherein the composition comprises about 55 wt. % to about 75 wt. % water, about 0.5 wt. % to about 5.0 wt. % phosphoric acid, and 20 wt. % to 50 wt. % of an organic acid.

12. The method of claim 1 wherein the composition comprises about 60 wt. % to about 70 wt. % water, about 2 wt. % to about 3 wt. % phosphoric acid, and 30 wt. % to 40 wt. % of an organic acid.

13. The method of claim 1 wherein the composition comprises about 40 wt. % to about 85 wt. % water, about 0.01 wt. % to about 10 wt. % phosphoric acid, and about 20 wt. % to about 50 wt. % of an organic acid; and at least one of a cleaning agent, surfactant, passivation agent, and oxidation agent.

14. A cleaning method in a semiconductor fabrication process, comprising:

providing a composition comprising about 40 wt. % to about 85 wt. % water, about 0.01 wt. % to about 10 wt. % phosphoric acid, and 10 wt. % to 60 wt. % ascorbic acid; and at least one of acetic acid, nitric acid, ethylene glycol, propylene glycol, and triethanolomine; and exposing a surface to the composition.

15. A cleaning method in a semiconductor fabrication process, comprising:

providing a composition comprising about 40 wt. % to about 85 wt. % water, about 0.01 wt. % to about 10 wt. % phosphoric acid, and about 20 wt. % to about 50 wt. % of an organic acid, wherein the organic acid is ascorbic acid or is an organic acid having two or more carboxylic acid groups; and exposing a surface to the composition.

16. A cleaning method in a semiconductor fabrication process, comprising:

providing a composition comprising about 40 wt. % to about 85 wt. % water, about 0.01 wt. % to about 10 wt. % phosphoric acid, and about 20 wt. % to about 50 wt. % of an organic acid; and exposing a surface to the composition.

17. A cleaning method in a semiconductor fabrication process, comprising:

providing a composition comprising about 40 wt. % to about 85 wt. % water, about 0.01 wt. % to about 10 wt. % phosphoric acid, and about 20 wt. % to about 50 wt. % of an organic acid having two or more carboxylic acid groups; and exposing a surface to the composition.

18. A cleaning method in a semiconductor fabrication process, comprising:

providing a composition comprising about 40 wt. % to about 85 wt. % water, about 0.01 wt. % to about 10 wt. % phosphoric acid, and 10 wt. % to 60 wt. % of citric acid; and exposing a surface to the composition.

19. A cleaning method in a semiconductor fabrication process, comprising:

providing a composition comprising about 40 wt. % to about 85 wt. % water, about 0.01 wt. % to about 10 wt. % phosphoric acid, and about 20 wt. % to about 50 wt. % of an organic acid selected from the group consisting of ascorbic acid, citric acid, or a combination thereof; and exposing a surface to the composition.

20. A cleaning method in a semiconductor fabrication process, comprising:

providing a composition comprising water, phosphoric acid, and about 20 wt. % to about 50 wt. % an organic acid; wherein the organic acid is ascorbic acid or is an organic acid having two or more carboxylic acid groups; and wherein the composition is heated to a temperature of about 30 to about 45 degrees Celsius; and exposing a surface to the composition.

21. The method of claim 20 wherein the water is present in about 40 wt. % to about 85 wt. % of the composition.

22. The method of claim 20 wherein the water is deionized water.

23. The method of claim 20 wherein the phosphoric acid is present in about 0.01 wt. % to about 10 wt. % of the composition.

24. The method of claim 20 wherein the organic acid is ascorbic acid.

25. The method of claim 20 wherein the organic acid is an organic acid having two or more carboxylic acid groups.

26. The method of claim 25 wherein the organic acid having two or more carboxylic acid groups is citric acid.

27. The method of claim 20 wherein the composition comprises about 40 wt. % to about 85 wt. % of water, about 0.01 wt. % to about 10 wt. % of phosphoric acid, and about 20 wt. % to about 50 wt. % of ascorbic acid or citric acid.

28. The method of claim 20 wherein the surface is of a conductive layer.

29. The method of claim 28 wherein the conductive layer comprises aluminum.

30. The method of claim 20 wherein the method includes etching a material resulting in metallized organic residue on at least a part of the surface.

31. The method of claim 20 wherein the composition comprises about 40 wt. % to about 85 wt. % water, about 0.01 wt. % to about 10 wt. % phosphoric acid, and about 20 wt. % to about 50 wt. % of an organic acid, wherein the organic acid is ascorbic acid or is an organic acid having two or more carboxylic acid groups.

32. The method of claim 20 wherein the composition comprises about 40 wt. % to about 85 wt. % water, about 0.01 wt. % to about 10 wt. % phosphoric acid, and about 20 wt. % to about 50 wt. % of ascorbic acid.

33. The method of claim 20 wherein the composition comprises about 40 wt. % to about 85 wt. % water, about 0.01 wt. % to about 10 wt. % phosphoric acid, and about 20 wt. % to about 50 wt. % of an organic acid having two or more carboxylic acid groups.

34. A cleaning method in a semiconductor fabrication process, comprising:

providing a composition comprising about 40 wt. % to about 85 wt. % water, about 0.01 wt. % to about 10 wt. % phosphoric acid, and about 10 wt. % to about 60 wt. % of citric acid;

heating the composition to a temperature of about 30 to about 45 degrees Celsius; and exposing a surface to the composition.

35. The method of claim 20 wherein the composition comprises about 40 wt. % to about 85 wt. % water, about 0.01 wt. % to about 10 wt. % phosphoric acid, and about 20 wt. % to about 50 wt. % of citric acid, ascorbic acid or a combination thereof.

36. The method of claim 20 wherein the composition comprises about 55 wt. % to about 75 wt. % water, about 0.5 wt. % to about 5.0 wt. % phosphoric acid, and 20 wt. % to 50 wt. % of an organic acid, wherein the organic acid is ascorbic acid or is an organic acid having two or more carboxylic acid groups.

37. The method of claim 20 wherein the composition comprises about 60 wt. % to about 70 wt. % water, about 2 wt. % to about 3 wt. % phosphoric acid, and 30 wt. % to 40 wt. % of an organic acid, wherein the organic acid is ascorbic acid or is an organic acid having two or more carboxylic acid groups.

38. The method of claim 20 wherein the composition comprises about 40 wt. % to about 85 wt. % water, about 0.01 wt. % to about 10 wt. % phosphoric acid, and about 20 wt. % to about 50 wt. % of an organic acid, wherein the organic acid is ascorbic acid or is an organic acid having two or more carboxylic acid groups; and at least one of a cleaning agent, surfactant, passivation agent, and oxidation agent.

39. A cleaning method in a semiconductor fabrication process, comprising:

providing a composition comprising about 40 wt. % to about 85 wt. % water, about 0.01 wt. % to about 10 wt. % phosphoric acid, and about 10 wt. % to about 60 wt. % of an organic acid, wherein the organic acid is ascorbic acid or is an organic acid having two or more carboxylic acid groups; and at least one of acetic acid, nitric acid, ethylene glycol, propylene glycol, and triethanolamine;

heating the composition to a temperature of about 30 to about 45 degrees Celsius; and exposing a surface to the composition.

40. A cleaning method in a fabrication process, comprising:

providing a composition comprising phosphoric acid, ascorbic acid, and about 40 wt. % to about 85 wt. % water; and at least one of acetic acid, nitric acid, ethylene glycol, propylene glycol, and triethanolamine; and exposing a surface to the composition.

41. A cleaning method in a fabrication process, comprising:

providing a composition comprising phosphoric acid, about 10 wt. % to about 60 wt. % citric acid, and about 40 wt. % to about 85 wt. % water; and exposing a surface to the composition.

* * * * *

UNITED STATES PATENT AND TRADEMARK OFFICE

CERTIFICATE OF CORRECTION

PATENT NO. : 7,087,561 B1
APPLICATION NO. : 10/187163
DATED : August 8, 2006
INVENTOR(S) : Yates et al.

It is certified that error appears in the above-identified patent and that said Letters Patent is hereby corrected as shown below:

On the Title page, in Item (73), in “Assignee”, in column 1, line 1, after “ID” insert -- 83716 --.

On the Title page, in Item (56), under “Foreign Patent Documents”, in column 2, line 1, after “4/1995” insert -- H01L 21/306 --.

On page 2, in Item (56), under “Foreign Patent Documents”, in column 1, line 1, after “7/1997” insert -- H01L 21/00 --.

On page 2, in Item (56), under “Foreign Patent Documents”, in column 1, line 2, after “8/1997” insert -- C11D 7/04 --.

On page 2, in Item (56), under “Foreign Patent Documents”, in column 1, line 3, after “4/1975” insert -- H01L 21/314 --.

On page 2, in Item (56), under “Foreign Patent Documents”, in column 1, line 4, after “1/1982” insert -- G09G 3/16 --.

On page 2, in Item (56), under “Foreign Patent Documents”, in column 1, line 5, after “1/1986” insert -- B41M 1/40 --.

On page 2, in Item (56), under “Foreign Patent Documents”, in column 1, line 6, after “6/1987” insert -- H01L 21/306 --.

On page 2, in Item (56), under “Foreign Patent Documents”, in column 1, line 7, after “9/1987” insert -- C23F 1/20 --.

On page 2, in Item (56), under “Foreign Patent Documents”, in column 1, line 8, after “6/1988” insert -- H01L 021/304 --.

On page 2, in Item (56), under “Foreign Patent Documents”, in column 1, line 9, after “2/1996” insert -- C11D 7/06 --.

On page 2, in Item (56), under “Foreign Patent Documents”, in column 1, line 10, after “2/1997” insert -- C11D 7/04 --.

On page 2, in Item (56), under “Foreign Patent Documents”, in column 2, line 1, after “5/1997” insert -- H01L 21/304 --.

UNITED STATES PATENT AND TRADEMARK OFFICE

CERTIFICATE OF CORRECTION

PATENT NO. : 7,087,561 B1 
APPLICATION NO. : 10/187163
DATED : August 8, 2006
INVENTOR(S) : Yates et al.

It is certified that error appears in the above-identified patent and that said Letters Patent is hereby corrected as shown below:

On page 2, in Item (56), under “Other Publications”, in column 2, line 4, delete “single” and insert -- Single --, therefor.

On page 2, in Item (56), under “Other Publications”, in column 2, line 25, delete “phosperic” and insert -- phosphoric --, therefor.

In column 1, line 9, after “2000” insert -- , --.

In column 8, line 20, delete “FIG. 11” and insert -- FIG. 1I --, therefor.

In column 9, line 32, in Claim 5, after “ascorbic acid” delete “or citric acid”.

In column 9, line 49, in Claim 11, delete “of an organic acid.” and insert -- ascorbic acid. --, therefor.

In column 9, line 53, in Claim 12, delete “of an organic acid.” and insert -- ascorbic acid. --, therefor.

In column 9, line 57, in Claim 13, delete “of an organic acid;” and insert -- ascorbic acid; --, therefor.

In column 9, line 66, in Claim 14, delete “triethanolomine;” and insert -- triethanolamine; --, therefor.

In column 10, line 15, in Claim 16, delete “of an organic acid;” and insert -- of ascorbic acid; --, therefor.

Signed and Sealed this

Twentieth Day of February, 2007

JON W. DUDAS
*Director of the United States Patent and Trademark Office*